FABRICATION OF SEMICONDUCTOR BODIES
Filed Oct. 1, 1962
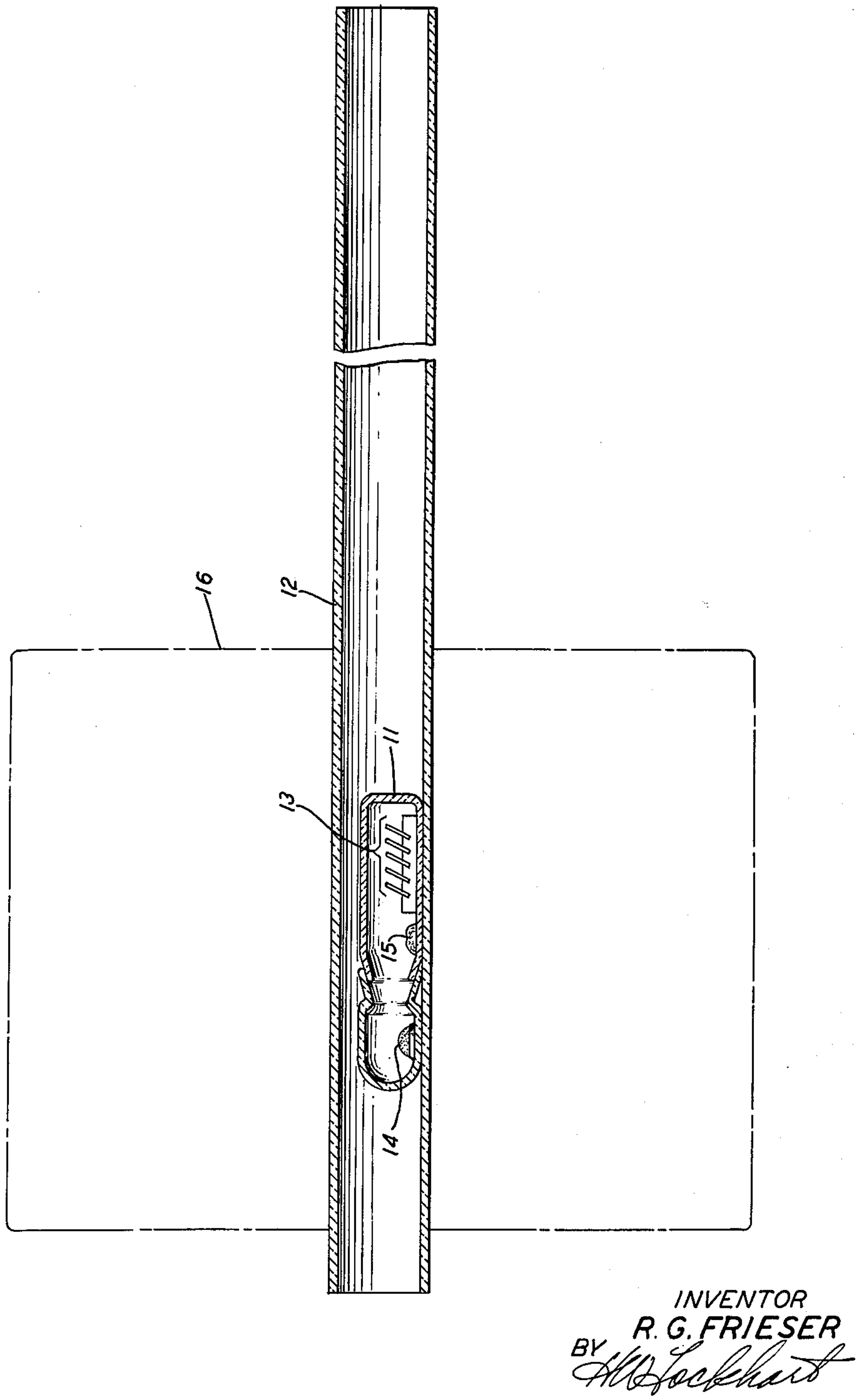
INVENTOR
R. G. FRIESER
BY [signature]
ATTORNEY 3,215,571

FABRICATION OF SEMICONDUCTOR BODIES

Rudolf G. Frieser, Neshanic Station, N.J., assignor to Bell Telephone Laboratories, Incorporated, New York, N.Y., a corporation of New York Filed Oct. 1, 1962, Ser. No. 227,456
1 Claim. (Cl. 148—189)

This invention relates to methods of making improved semiconductor devices and, more particularly, to an improved method for altering the conductivity in portions of compound semiconductor bodies.

The use of compound semiconductors has become increasingly important because of their superior properties for certain applications, for example, in the field of photoeffect devices. Well known among such compound semiconductors are the arsenides and phosphides of alminum, indium and gallium, generally known as III–V semiconductor compounds. Also grouped with these compounds are the II–VI semiconductor compounds of zinc and cadmium.

A considerable amount of effort has been applied to adapt relatively well-known device fabrication techniques used with the elemental semiconductors, germanium and silicon, to the field compound semiconductors. In some instances, a fairly straightforward adaptation of techniques is possible. However, many of the compound semiconductors when subjected to tempeartures used for solid state diffusion, becasue of the relative volatility of one or both elements of the compound, suffer surface erosion to the extent that useful devices cannot be produced. This is particularly a problem where the quality of the PN junctions produced by successive multiple diffusions is vitally dependent upon the condition of the surface undergoing diffusion.

In the course of developments to overcome this surface erosion problem, a number of useful expedients have been suggested. For example, in the United States Patents No. 3,070,467, issued to C. S. Fuller, J. M. Whelan on December 25, 1962; No. 3,085,032 issued to C. S. Fuller on April 9, 1963; and C. S. Fuller, Serial No. 188,633, filed April 19, 1962, all assigned to the same assignee as this application, techniques are suggested for conditioning the ambient during the diffusion process to inhibit surface erosion.

An object of this invention is to improve and facilitate the diffusion heat treatment of compound semiconductors.

More specifically, an object of this invention is to diffusion heat treat compound semiconductors with substantially no degradation of polished surfaces.

Another specific object is to inhibit surface erosion and to produce, controllably, more uniform PN junctions in gallium arsenide semiconductor bodies.

Another object is a technique for simultaneous double diffusion of a compound semiconductor to produce two PN junctions.

These and other objects are realized by using as a diffusant source, particularly for donor impurities, a metallic sulfide or selenide compound. In particular, useful PN junctions have been produced in P-type conductivity gallium arsenide by diffusion heat treatments at about 900 degrees centigrade using, for example, aluminum sulfide or arsenic trisulfide as the diffusant source. This technique contrasts with prior art methods which, insofar as applicant is aware, employ substantially pure elements as diffusant sources. For diffusion temperatures in the range from about 700 degrees centigrade to 1100 degrees centigrade, both sulfide and selenide compounds have been employed.

Thus a feature of this invention is the use of sulfide and selenide compounds for diffusant sources for diffusion heat treating compound semiconductors, particularly those wherein one of the elements of the compound is highly volatile such as phosphorous or arsenic.

The invention and its other objects and features will be more clearly understood from the following detailed description taken in conjunction with the drawing which shows schematically one form of apparatus for practicing the invention.

Referring to the drawing, there is shown a two-piece quartz ampule or tube 11 having a ground-glass joint, of a type well known for so-called "box" diffusion heat treatments of semiconductor materials. The quartz container 11 is shown in a tubular furnace 12 represented schematically in cross section. The area 16, delineated by the broken line, represents an oven or similar enclosure.

Within the container 11 there is placed a stack or array of slices 13 of monocrystalline gallium arsenide semiconductor material. Specifically in this instance, in order to produce PN junctions useful as rectifying elements, the slices 13 are of P-type conductivity. At the other end of the container there is placed a small quantity of the compound in powder form to provide the source of the diffusant impurity. Specifically, this may consist of several hundred micrograms of aluminum sulfide or arsenic trisulfide. Also within the container there is advantageously included a quantity 15 of crushed gallium arsenide to produce an added effect in accordance with the disclosure of the above, last-noted application of Fuller.

In one method in accordance with this invention the container sections are loaded with the above-noted materials flushed with an inert gas such as argon, evacuated, and sealed. The container 11 then is moved into the pre-heated furnace and held at a temperature of about 900 degrees centigrade for a period of from about one-half to 16 hours or more depending upon the depth of penetration desired. For example, using arsenic trisulfide as a diffusant and heating for about two hours produces a PN junction at a depth of about two microns. Lengthening the treatment to 16 hours results in a junction at a depth of about three microns.

At the conclusion of the heating operation, it is desirable to terminate the diffusion reaction as abruptly as possible and to this end it is customary to produce quickly a cold region in the portion of the container near the end containing the diffusant compound 14. Most advantageously this cold region is produced at one end while the opposite end of the container remains at a relatively high temperature so that all of the diffusant condenses at the end away from the slice stack 13.

Typically, this cold region may be produced by contacting the container exterior with a wand of wet-cooled asbestos or a stream of cold water. Advantageously, the furnace is of a type having precise temperature control and uniform heat distribution so that during heat treatment there is a minimum of transport of impurity material. One desirable form of heating may utilize radio-frequency induction apparatus.

The compounds disclosed herein as diffusant sources produce markedly improved results apparently because of the relation between the decomposition rate of the compound and the temperature of the heat treatment. For example, aluminum sulfide melts at just above 1100 degrees centigrade and, at a diffusion temperature of 900 degrees centigrade, the amount of sulfur available as a dopant is substantially a constant determined by the amount of decomposition at this temperature. Accordingly, in general, it is possible to provide, controllably, sufficient dopant to enable diffusion to go forward without deleterious deposition of materials or undesirable surface erosion. This procedure contrasts with the use of the pure element sulfur as the source wherein the entire supply may be vaporized and result in an uncontrolled over-supply of dopant in the diffusion chamber.

The method of this invention has also been applied to simultaneous double diffusion of a compound semiconductor to produce two junctions. In one specific example, an N-type wafer of gallium arsenide was placed in a flushed and sealed container with 400 micrograms of powdered zinc selenide and a quantity of crushed gallium arsenide, and heated at 900 degrees centigrade for one-half hour. Following this treatment the zinc compound was removed from the container which was then resealed. After heating at 900 degrees centigrade for one hour, the wafer was removed and examined. By angle lapping, and using a stain technique, the wafer appeared to have an N-type surface region produced by the slower diffusing sulfur to a depth of 2.3 microns. Between this N-type surface region and the original N-type wafer material, there was a 1.3 micron thick region of P-type conductivity produced by the faster diffusing zinc. The exposed surface of the wafer sustained relatively little surface erosion and rendered the wafer suitable for fabrication into a device such as a transistor.

In addition to the above-noted compounds, aluminum sulfide, arsenic trisulfide, and zinc selenide, useful PN junctions have been produced without substantial degradation of surfaces using germanium monosulfide and disulfide, arsenic disulfide, stannous sulfide, molybdenum selenide, molybdenum trisulfide, arsenic trisulfide, phosphorous pentasulfide, gallium sulfide, and zinc sulfide.

In another specific example, a slice of gallium arsenide semiconductor material having a conductivity of 5.3 to $10^{-2}$ ohm-centimeters was heated at a temperature of 900 degrees for a period of two hours using as a diffusant source 430 micrograms of arsenic trisulfide. After completion of this treatment, the slice was observed to have retained its highly polished surface and to contain a PN junction at a depth of .56 micron from the polished surface.

Although the foregoing disclosure is specifically in terms of diffusing gallium arsenide, the suggested diffusant source compounds may likewise find application for improved diffusion treatment of the phosphides and arsenides of the III–V compound group. It will be further understood that other specific arrangements and procedures may be devised by those skilled in the art which will fall within the scope and spirit of the invention as recited in the appended claim.

What is claimed is:

In the fabrication of a semiconductor device the steps of providing a body of gallium arsenide semiconductor material having at least a portion of N-type conductivity, placing said body in a container with a quantity of zinc selenide, heating said container at a temperature in the range from about 700 degrees centigrade to 1100 degrees centigrade for a period of at least one-half hour, and abruptly terminating the diffusion reaction, removing the zinc selenide from said container, resealing said container, heating said container at a temperature in the range from about 700 to 1100 degrees centigrade for about one hour, thereby to cause diffusion of zinc and selenium into less than the whole of said N-type portion, the selenium diffusing to a lesser depth than zinc so as to form at least two PN junctions.

References Cited by the Examiner

UNITED STATES PATENTS

| | | | |
|---|---|---|---|
| 2,827,403 | 3/58 | Hall et al. | 148—1.5 |
| 2,834,697 | 5/58 | Smits | 148—1.5 |
| 2,898,248 | 8/59 | Silvey et al. | 148—1.5 |
| 2,928,761 | 3/60 | Gremmelmaier et al. | 148—1.5 |
| 2,929,859 | 3/60 | Loferski | 136—89 |
| 2,979,429 | 4/61 | Cornelison et al. | 148—1.5 |
| 3,003,900 | 10/61 | Levi | 148—1.5 |
| 3,015,590 | 1/62 | Fuller | 148—1.5 |
| 3,154,446 | 10/64 | Jones | 148—189 |

BENJAMIN HENKIN, *Primary Examiner.*

DAVID L. RECK, *Examiner.*